United States Patent [19]
Tanabe et al.

[11] Patent Number: 6,132,928
[45] Date of Patent: Oct. 17, 2000

[54] COATING SOLUTION FOR FORMING ANTIREFLECTIVE COATING FILM

[75] Inventors: Masahito Tanabe; Kazumasa Wakiya; Masakazu Kobayashi; Toshimasa Nakayama, all of Kanagawa, Japan

[73] Assignee: Tokyo Ohka Kogyo Co., Ltd., Kanagawa, Japan

[21] Appl. No.: 09/148,997

[22] Filed: Sep. 8, 1998

[30] Foreign Application Priority Data

Sep. 5, 1997 [JP] Japan .................................. 9-256227

[51] Int. Cl.$^7$ ...................................................... G03C 1/72
[52] U.S. Cl. ..................................... 430/270.1; 430/281.1; 430/286.1; 430/905; 430/920; 430/273.1
[58] Field of Search ............................. 430/270.1, 281.1, 430/286.1, 75, 920, 273.1

[56] References Cited

U.S. PATENT DOCUMENTS 5,631,314  5/1997  Wakiya et al. ........................... 524/165
5,783,362  7/1998  Wakiya et al. ........................ 430/273.1

*Primary Examiner*—John S. Chu
*Assistant Examiner*—Yvette M. Clarke
*Attorney, Agent, or Firm*—Sughrue, Mion, Zinn, Macpeak & Seas, PLLC

[57] ABSTRACT

A coating solution for forming an antireflective coating film making it possible to form a uniform coating film, which sustains an antireflective effect and shows no unevenness of coating or little surface discontinuity, even in a small application dose and thus ensuring the production of semiconductor devices at a low cost and a high efficiency. The coating solution for forming an antireflective coating film is one to be used for forming an anti-interference film on a resist film, characterized in that the coating solution gives a contact angle to the resist film of 15° or below, when applied onto the resist film.

6 Claims, No Drawings

COATING SOLUTION FOR FORMING ANTIREFLECTIVE COATING FILM

FIELD OF THE INVENTION

The present invention relates to a coating solution for forming an antireflective coating film. More particularly, it relates to a coating solution for forming an antireflective coating film which relieves the multiple interference of light in a resist film to thereby prevent the decrease in the resist pattern accuracy in pattern making by the lithographic technique.

BACKGROUND OF THE INVENTION

To manufacture semiconductor devices, there has been employed the lithographic technique which comprises forming a resist film on a substrate such as silicone wafers and selectively irradiating the same with actinic beams such as UV rays, far UV rays, excimer laser, X-ray or electron beams, followed by the development, to thereby form a resist pattern on the substrate. The resists to be employed in the lithographic technique are appropriately selected from negative-type resists in which the parts unirradiated with the actinic beams are dissolved and removed in the step of the development and positive-type resists in which the irradiated parts are dissolved and removed in the step of the development depending on the purpose.

In the pattern making by the lithographic technique, however, it is known that the multiple interference of light arises in a resist film and thus the dimensional width of the resist pattern varies with a change in the resist film thickness. The term "multiple interference of light" means a phenomenon which arises when an incident light having a single wavelength on a resist film interferes with a light reflected from the substrate, thus causing a difference in the light energy absorbed in the thickness direction of the resist film. The unevenness in the resulting resist film affects the dimensional width of the resist pattern obtained after the development to deteriorate dimensional accuracy of the resist pattern. This problem becomes noticeable, in particular, in the formation of a fine resist pattern on a stepped substrate. When a resist is applied onto such a stepped substrate, the resist film becomes uneven correspondingly to the stepped parts to thereby deteriorate dimensional accuracy of the resist pattern. Accordingly, it has been required to develop a technique by which the problem of the interference of light can be overcome and a fine pattern can be formed at a high dimensional accuracy even on a stepped substrate.

To relieve the interference of light, there have been proposed methods for forming an antireflective coating film on a resist film. For example, JP-B-4-55323 and JP-A-3-222409 disclose methods for forming water-soluble resin films of polysiloxane, polyvinyl alcohol, etc., while JP-A-5-188598 proposes a method for forming an antireflective coating film by using a film-forming composition containing fluorine which is water-soluble and removable with water (the term "JP-A" as used herein means an "unexamined published Japanese patent application", while the term "JP-B" as used herein means an "examined Japanese patent publication"). Although the antireflective coating films formed by the former methods exhibit antireflective effects to a certain extent, the coating films thus formed are poor in uniformity and frequently show unevenness of coating. To solve this problem, coating solutions for forming antireflective coating films are applied in a large amount in the above-mentioned methods.

In the field of manufacturing semiconductor devices, it has been urgently required to lower the production cost and elevate the productivity, as well as to improve the technical problems associating with fine processing. However, coating solutions for forming antireflective coating films are used in a large amount in the methods for forming antireflective coating films proposed by the publications cited above, which results in an increase in the production cost. Thus, it has been strongly required to develop a coating solution for forming an antireflective coating film which makes it possible to form a uniform antireflective coating film showing no unevenness of coating or little surface discontinuity even in a small application dose.

SUMMARY OF THE INVENTION

Under these circumstances, the present inventors have conducted extensive studies and consequently found out that an antireflective coating film, which sustains an antireflective effect fully satisfying the requirement for fine dimensional processing and shows no unevenness of coating or little surface discontinuity even in a small application dose can be formed by using a coating solution which gives a contact angle to a resist film of 15° or below, when applied onto the resist film, thus completing the present invention.

Accordingly, an object of the present invention is to provide a coating solution for forming an antireflective coating film making it possible to form a uniform coating film, which sustains an antireflective effect and shows no unevenness of coating or little surface discontinuity, even in a small application dose.

Another object of the present invention is to provide a coating solution for forming an antireflective coating film enables a semiconductor device to be produced at a reduced cost and an elevated productivity.

The present invention, which aims at achieving the above objects, relates to a coating solution for forming an antireflective coating film which is a solution for forming an anti-interference film on a resist film, wherein the coating solution gives a contact angle to the resist film of 15° or below, when applied onto the resist film.

DETAILED DESCRIPTION OF THE INVENTION

When applied onto a resist film and dried, the coating solution for forming an antireflective coating film of the present invention can exert an effect of preventing the multiple interference of light and give a contact angle to the resist film of 15° or below, preferably 10° or below, as described above. The term "contact angle" as used herein means the angle including the coating solution among the angles formed by the tangent to the coating solution and the resist film at the contact point of the coating solution for forming an anti-interference film with the resist film at room temperature.

The coating solution for forming an antireflective coating film of the present invention can be an arbitrary one, so long as the contact angle thereof to the resist film falls within the range as specified above. Most preferred example of the coating solution for forming an antireflective coating film is a coating solution containing a water-soluble, film-forming component, a fluorinated surfactant and an N-alkyl-2-pyrrolidone.

Examples of the water-soluble, film-forming component include cellulose-based polymers such as hydroxypropylmethyl cellulose phthalate, hydroxypropylmethyl cellulose acetate phthalate, hydroxypropylmethyl cellulose acetate succinate, hydroxypropylmethyl cellulose hexahydrophthalate, hydroxypropylmethyl cellulose, hydroxypropylethyl cellulose, hydroxypropyl cellulose, cellulose acetate hexahydrophthalate, carboxymethyl cellulose, ethyl cellulose and methyl cellulose; acrylic polymers having, as a monomer, N,N-dimethylaminopropyl methacrylamide, N,N-dimethylaminopropyl acrylamide, N,N-dimethyl acrylamide, N,N-dimethylaminoethyl methacrylate, N,N-diethylaminoethyl methacrylate, N,N-dimethylaminoethyl acrylate, N-methyl acrylamide, diacetone acrylamide, acryloyl morpholine and acrylic acid; and vinyl polymers such as polyvinyl alcohol and polyvinyl pyrrolidone. Among all, it is preferable to use vinyl polymers and acrylic polymers, in particular, polyvinyl pyrrolidone and polyacrylic acid, since these polymers are excellent in the effect of lowering the contact angle to a resist film. These water-soluble, film-forming components can be used singly or a mixture of two or more thereof.

Examples of the fluorinated surfactant include perfluoroheptanoic acid, perfluorooctanoic acid, perfluoropropylsulfonic acid, perfluorooctylsulfonic acid, perfluorodecylsulfonic acid, ammonium perfluoroheptanoate, ammonium perfluorooctanoate, ammonium perfluorooctylsulfonate, tetramethylammonium perfluoropropylsulfonate, tetramethylammonium perfluoroheptanoate, tetramethylammonium perfluorooctylsulfonate, tetramethylammonium perfluorodecylsulfonate, monoethanolamine perfluoropropylsulfonate, monoethanolamine perfluorooctanoate, monoethanolamine perfluorooctylsulfonate and monoethanolamine perfluorodecylsulfonate. More specifically, use may be made of commercially available ones, for example, EF-201 as perfluoroheptanoic acid, EF-101 as perfluorooctylsulfonic acid, EF-104 and FC-93 as ammonium perfluorooctylsulfonate, EF-204 and FC-143 as ammonium perfluoroheptanoate and FC-120 as ammonium perfluorodecylsulfonate (available from Tohkem Products Corporation). Alternatively, they can be easily prepared. Among these fluorinated surfactants, monoethanolamine salts are preferable, and monoethanolamine perfluorooctylsulfonate is particularly preferable, since it is excellent in the anti-interference effect, solubility in water and easiness in pH regulation.

Examples of the N-alkyl-2-pyrrolidone include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone and N-octadecyl-2-pyrrolidone. Among all, N-octyl-2-pyrrolidone and N-dodecyl-2-pyrrolidone are preferable, since they are easily available from SP Japan respectively under the trade names of LP100 and LP300. It is particularly preferable to use N-octyl-2-pyrrolidone, since it can form a uniform coating film.

The coating solution for forming an antireflective coating film which contains the above-mentioned water-soluble, film-forming component, fluorinated surfactant and N-alkyl-2-pyrrolidone is usually employed in the form of an aqueous solution, wherein the content of the water-soluble, film-forming component preferably ranges from 0.5 to 10% by weight while the content of the fluorinated surfactant preferably ranges from 1.0 to 15% by weight. The N-alkyl-2-pyrrolidone can be used generally at a ratio of from 100 to 10,000 ppm, preferably from 150 to 5,000 ppm, based on the coating solution containing the water-soluble, film-forming component and the fluorinated surfactant dissolved therein.

In addition to the above-mentioned components, the coating solution for forming an antireflective coating film of the present invention may further contain alcoholic organic solvents (isopropyl alcohol, etc.) and other surfactants than the fluorinated surfactant so as to improve the coating film properties. Preferable examples of the surfactants usable herein include anionic surfactants such as ammonium alkyl diphenyl ether sulfonate, tetramethylammonium alkyl diphenyl ether sulfonate, trimethylethanolammonium alkyl diphenyl ether sulfonate, triethylammonium alkyl diphenyl ether sulfonate, ammonium alkyl diphenyl ether disulfonate, diethanolammonium alkyl diphenyl ether disulfonate and tetramethylammonium alkyl diphenyl ether disulfonate.

The resist for forming a resist film, onto which the coating solution for forming an antireflective coating film of the present invention is to be applied, may be arbitrarily selected from among those conventionally employed in the art without restriction. Either positive type resists or negative type resists can be used. It is particularly preferable to use a resist which is composed of a photosensitive substance and a film-forming substance and can be easily developed with an aqueous alkali solution. Among all, it is preferable to use positive-type and negative-type resists applicable to ultra-fine processing. Examples of the positive-type resist include a positive-type resist containing a quinonediazide photosensitive substance and a film-forming substance and a chemically amplified resist the alkali solubility of which is elevated by the catalytic action of an acid generated during the exposure.

Examples of the former quinonediazide photosensitive substance include a compound containing a quinonediazide group such as those obtained by partly or completely esterifying or partly or completely amidating a quinonediazide sulfonic acid (sulfonic acids of o-quinonediazide, o-naphthoquinonediazide, o-anthraquinonediazide, etc.) with a compound having a phenolic hydroxyl group or an amino group. Examples of the above-mentioned compounds having a phenolic hydroxyl group or an amino group include polyhydroxybenzophenones (2,3,4-trihydroxybenzopheone, 2,3,4,4'-tetrahydroxybenzophenone, 2,2',4,4'-tetrahydroxybenzophenone, etc.), aryl gallate, phenol, p-methoxyphenol, dimethylphenol, hydroquinone, bisphenol A, naphthol, pyrocatechol, pyrogallol, pyrogallol monomethyl ether, pyrogallol-1,3-dimethyl ether, gallic acid, esterified or etherified gallic acid carrying a residual hydroxyl group, aniline and p-aminodiphenylamine. Particularly preferable examples of the quinonediazide group-containing compound include the products obtained by completely or partly esterifying polyhydroxybenzophenone with naphthoquinone-1,2-diazide-5-sulfonyl chloride or naphthoquinone-1,2-diazide-4-sulfonyl chloride.

Preferable examples of the film-forming substance include an alkali-soluble resin such as novolak resins obtained from phenol, cresol, xylenol, etc. with aldehydes, acrylic resins, styrene/acrylic acid copolymers, hydroxystyrene copolymers, polyhydroxybenzoate and polyvinyl hydroxybenzal. Among all, novolak resins obtained by polymerizing cresol and/or xylenol with aldehydes are preferable. In particular, it is preferable to use a novolak resin having a weight-average molecular weight of from 2,000 to 20,000, more preferably from 5,000 to 15,000, from which low molecular weight components have been preferably removed.

The content of the photosensitive substance in the positive-type resist containing a quinonediazide photosensitive substance and a film-forming substance is generally from 10 to 40 parts by weight, preferably from 15 to 30 parts by weight, per 100 parts by weight of the film-forming substance.

As the negative-type resist, use may be made of those commonly employed in the art as a negative-type resist without restriction. It is preferable to use a chemically amplified negative-type resist containing three components (i.e., a crosslinking agent, an acid-generating agent and a base polymer) which has been employed as a negative-type resist for fine pattern making.

Now, an example of the method for using the coating solution for forming an antireflective coating film of the present invention will be illustrated. First, a resist film is formed on a substrate such as a silicone wafer. Then, the coating solution for forming an antireflective coating film of the present invention is applied thereon by using a coating means, for example, a spinner. In this application step, it is highly important to prepare the coating solution for forming an antireflective coating film in such a manner as to give a contact angle thereof to the resist film of 15° or below. Next, the coating film is thermally treated to thereby form an antireflective coating film on the resist film. This heating procedure may be optionally performed. That is to say, it may be omitted when a highly uniform coating film can be formed merely by the application. Subsequently, the resist film is selectively irradiated, via the above-mentioned antireflective coating film, with an actinic beam such as UV rays, far UV rays, excimer laser, X-ray or electron beam, followed by the development to thereby form a resist pattern on the silicone wafer.

EXAMPLES

To further illustrate the present invention in greater detail, and not by way of limitation, the following Examples will be given.

Example 1

A positive-type resist (THMR-iP3300, manufactured by Tokyo Ohka Kogyo Co., Ltd.) containing a cresol novolak resin and a naphthoquinonediazide compound was applied onto 12 silicone wafers (6 in) by the spinner coating method and then dried at 90° C. for 90 seconds to thereby give silicone wafers each having a resist film of 0.96 to 1.09 $\mu$m formed thereon.

Separately, 500 g of a 20% by weight aqueous solution of perfluorooctylsulfonic acid (EF-101, manufactured by Tohkem Products Corporation) was mixed with 30 g of a 20% by weight aqueous solution of monoethanolamine. 22 g of the resultant mixture was added to 10 g of a 20% by weight aqueous solution of polyacrylic acid. Then, purified water was added to the thus obtained aqueous solution to give a total amount of 200 g. To the resultant aqueous solution was added 500 ppm of N-octyl-2-pyrrolidone (LP100, manufactured by ISP Japan) to thereby give a coating solution for forming an antireflective coating film.

Subsequently, the obtained coating solution for forming an antireflective coating film was applied by using a spinner onto the resist film formed on each of the 12 silicone wafers prepared above. Thus, a uniform coating film (thickness: 65 nm) with no unevenness of coating was formed on the resist film on each silicone wafer. The amount of the coating solution for forming an antireflective coating film thus employed was 2.00 cc. When measured with a contact angle meter CA-X150 (manufactured by Kyowa Interface Science Co., Ltd.), the contact angle of the coating film thus obtained to the resist film was 8°. When the surface discontinuity of the coating film thus obtained was examined by using a surface discontinuity meter WIS-850 (manufactured by Canon Inc.), 10 particles of 0.2 $\mu$m or above in size were observed per wafer. The silicone wafers were allowed to stand in a clean room for 48 hours and then the surface discontinuity was measured again. As a result, 11 particles were observed per wafer.

Next, the resist film was irradiated with actinic rays via the mask pattern with the use of a reduction exposure projector NSR-1755I10D (manufactured by Nikon Corporation) and then baked on a hot plate at 110° C. for 90 seconds followed by the paddle development with a 2.38% by weight aqueous solution of tetramethylammonium hydroxide at 23° C. for 65 seconds. Washing was effected with purified water for 30 seconds to form a resist pattern. Then, a line pattern of 0.45 $\mu$m was formed on each of the 12 silicone wafers under the same exposure. The maximum dimensional change determined from the relationship between the line pattern size and the resist film thickness was 0.023 $\mu$m. On the other hand, the line pattern of 0.45 $\mu$m was formed in the same manner as described above except for using no coating solution for forming an antireflective coating film. In this case, the maximum dimensional change was 0.071. Thus, it was confirmed that the above-mentioned coating solution for forming an antireflective coating film was capable of forming a practically usable antireflective coating film.

Example 2

A coating solution for forming an antireflective coating film was prepared in the same manner as in Example 1 except for using a 20% by weight aqueous solution of polyvinyl pyrrolidone as a substitute for the 20% by weight aqueous solution of polyacrylic acid. Then, evaluation was carried out in the same manner as in Example 1. The amount of the coating solution for forming an antireflective coating film thus applied was 2.0 cc, while the contact angle of the coating solution to the resist film was 7°. When the surface discontinuity of the obtained coating film was examined, 5 particles of 0.2 $\mu$m or above in size were observed per wafer. After allowing the silicone wafers to stand in a clean room for 48 hours, 6 particles were observed per wafer.

The antireflective effect of these silicone wafers was examined in the same manner as in Example 1. As a result, it was confirmed that an antireflective effect comparable to that of Example 1 was established.

Comparative Example 1

A coating solution for forming an antireflective coating film was prepared in the same manner as in Example 2 except for using 500 ppm of a tertiary acetylene glycol surfactant (Surfynol 104, manufactured by Nissin Chemical Industry Co., Ltd.) as a substitute for the N-octyl-2-pyrrolidone (LP100, manufactured by ISP Japan). Then, evaluation was carried out in the same manner as in Example 1. The amount of the coating solution for forming an antireflective coating film thus applied was 2.5 cc, while the contact angle of the coating solution to the resist film was 20°. When the surface discontinuity of the obtained coating film was examined, 10 particles of 0.2 $\mu$m or above in size were observed per wafer. After allowing the silicone wafers to stand in a clean room for 48 hours, 10,000 particles were observed per wafer and thus these silicone wafers were unusable in practice.

Comparative Example 2

A coating solution for forming an antireflective coating film was prepared in the same manner as in Example 1 except for using 1,000 ppm of a polyoxyethylene polyoxypropylene surfactant (Pionin P-2310, manufactured by Takemoto Oil & Fat Co., Ltd.) as a substitute for the N-octyl-2-pyrrolidone (LP100, manufactured by ISP Japan). Then, evaluation was carried out in the same manner as in Example 1. The amount of the coating solution for forming an antireflective coating film thus applied was 3.0 cc, while the contact angle of the coating solution to the resist film was 22°. When the surface discontinuity of the obtained coating film was examined, 10 particles of 0.2 μm or above in size were observed per wafer. After allowing the silicone wafers to stand in a clean room for 48 hours, 10,000 particles were observed per wafer and thus these silicone wafers were unusable in practice.

The coating solution for forming an antireflective coating film of the present invention makes it possible to form a uniform coating film, which sustains an antireflective effect and shows no unevenness of coating or little surface discontinuity, even in a small application dose. By using this coating solution for forming an antireflective coating film, semiconductor devices can be produced at a reduced cost and an elevated productivity.

While the invention has been described in detail and with reference to specific embodiments thereof, it will be apparent to one skilled in the art that various changes and modifications can be made therein without departing from the spirit and scope thereof.

What is claimed is:

1. An aqueous coating solution for forming an antireflective coating film which is to be used for forming an anti-interference film on a resist film, consisting of a water-soluble, film forming component, a fluorinated surfactant, and an N-alkyl-2-pyrolidone, wherein said coating solution gives a contact angle to said resist film of 15° or below, when applied onto the resist film.

2. The coating solution as claimed in claim 1, wherein said N-alkyl-2-pyrrolidone is N-octyl-2-pyrrolidone.

3. The coating solution as claimed in claim 1, wherein the content of the water-soluble, film-forming component is from 0.5 to 10% by weight.

4. The coating solution as claimed in claim 1, wherein the content of the fluorinated surfactant is from 1.0 to 15% by weight.

5. The coating solution as claimed in claim 1, wherein the N-alkyl-2-pyrrolidone is added at a ratio of from 100 to 10,000 ppm based on the coating solution containing the water-soluble, film-forming component and the fluorinated surfactant dissolved therein.

6. An aqueous coating solution for forming an antireflective coating film which is to be used for forming an anti-interference film on a resist film, consisting of a water-soluble, film forming component, a fluorinated surfactant, an N-alkyl-2-pyrolidone and an alcoholic organic solvent, wherein said coating solution gives a contact angle to said resist film of 15° or below, when applied onto the resist film.

* * * * *